United States Patent
Lee

(10) Patent No.: US 7,463,088 B2
(45) Date of Patent: Dec. 9, 2008

(54) PWM DIGITAL AMPLIFIER WITH HIGH-ORDER LOOP FILTER

(75) Inventor: Wai L. Lee, Austin, TX (US)

(73) Assignee: ASP Technologies, Austin, TX (US)

(*) Notice: Subject to any disclaimer, the term of this patent is extended or adjusted under 35 U.S.C. 154(b) by 0 days.

(21) Appl. No.: 11/307,988

(22) Filed: Mar. 2, 2006

(65) Prior Publication Data

US 2007/0024354 A1   Feb. 1, 2007

Related U.S. Application Data

(63) Continuation of application No. 10/811,453, filed on Mar. 26, 2004, now Pat. No. 7,038,535.

(60) Provisional application No. 60/458,889, filed on Mar. 29, 2003.

(51) Int. Cl.
*H03F 3/38* (2006.01)

(52) U.S. Cl. .................. 330/10; 330/207 A; 330/251
(58) Field of Classification Search ............... 330/10, 330/207 A, 251
See application file for complete search history.

(56) References Cited

U.S. PATENT DOCUMENTS 5,352,986 A * 10/1994 Modgil et al. .............. 330/10
5,521,549 A *  5/1996 Nelson ....................... 330/10
5,815,581 A *  9/1998 Andersson ................. 330/251
6,140,875 A * 10/2000 Van Den Homberg et al. 330/10

* cited by examiner

*Primary Examiner*—Khanh Van Nguyen
(74) *Attorney, Agent, or Firm*—JP Cody

(57) ABSTRACT

An improved PWM amplifier is disclosed that uses multiple integrators in the loop filter to provide high loop gain across the frequency band-of-interest. The frequency characteristics of the loop filter are optimized to distribute large loop gains across the entire band to provide large suppression of noise and distortions generated in the modulation and output stages.

24 Claims, 6 Drawing Sheets

PWM Digital Amplifier With High-Order Loop Filter by Wai Laing Lee
Sheet 5 of 6

PWM DIGITAL AMPLIFIER WITH HIGH-ORDER LOOP FILTER

CROSS REFERENCE TO RELATED APPLICATION

This continuation patent application claims the benefit of U.S. patent application Ser. No. 10/811,453, filed Mar. 26, 2004 now U.S. Pat. No. 7,038,535 and Provisional Application No. 60/458,889, filed Mar. 29, 2003, by the inventor, which is hereby incorporated.

FIELD OF THE INVENTION

The present invention relates generally to amplifiers. More specifically, the present invention relates to systems for efficient amplification of signals using Class D or PWM (pulse width modulation) digital amplifiers.

BACKGROUND OF THE INVENTION

Amplifier designers and manufacturers continue to be pressured to reduce costs, improve efficiency, decrease size & power dissipation, improve output signal quality, reduce electromagnetic and radio frequency emissions, and increase tolerance of noise, distortion, & interference. Although there does not appear to be one complete solution, various signal amplification systems and methods have been proposed to address the various problems.

One technique that has been proposed to increase efficiency over traditional linear amplification is pulse-width modulation (PWM). Despite their inherent power efficiency advantages, there are many difficulties that make it difficult for PWM (or Class D) digital amplifiers to achieve high fidelity performance that can compete effectively with conventional linear (or Class AB) analog amplifiers.

With PWM amplifiers, power supply noise, jitter, circuit noise, and non-linearities in the modulating carrier waveform may be modulated onto the PWM output. Furthermore, to better compete with traditional solutions, it is desirable to reduce the sensitivity of PWM amplifiers to these noise and error sources in order to relax overall system requirements and reduce system costs. Sophisticated techniques have been proposed to attack each of these noise components with limited success. In many instances, the proposed solution increases size, complexity and cost.

Amplifier systems and methods also have the problem in various applications of amplifying signals that have a wide dynamic range. An example of such an application is audio power amplification where there may be a wide dynamic range of audio signal content. Depending upon the design, the amplifier apparatus may be saturated and the amplified signals distorted. In such instances, it is highly desirable for the amplifier to saturate gracefully so that the amplifier comes out of saturation while maintaining stability. When the amplifier is operating in a mode that regularly goes into saturation, the amplifier's overload handling characteristics can dominate in the perceived signal quality, and can make an otherwise acceptable output signal unacceptable. Therefore, it is important for the amplifier to come out of saturation as quickly as possible when the overload condition is no longer present. In PWM amplifiers with sophisticated feedback arrangements, it is very difficult to maintain stability during overload conditions since the closed loop dynamics are disrupted.

SUMMARY OF THE INVENTION

In accordance with the present invention, a pulse-width modulated signal amplifier and amplification method amplifies an incoming signal and produces an output digital signal using a pulse-width amplification technique that includes a feedback loop filter.

In accordance with another aspect of the invention, the feedback loop filter uses an integrator filter with a filter order higher than one.

In accordance with another aspect of the invention, the feedback loop filter includes a limiter to control overload.

In accordance with another aspect of the invention, the feedback loop filter includes a technique that is inherently stable as it recovers from overload.

BRIEF DESCRIPTION OF THE DRAWINGS

The accompanying drawings incorporated in and forming a part of the specification, illustrates several aspects of the present invention, and together with the description serves to explain the principles of the invention. In the drawings.

DETAILED DESCRIPTION OF THE INVENTION

Figure 1:
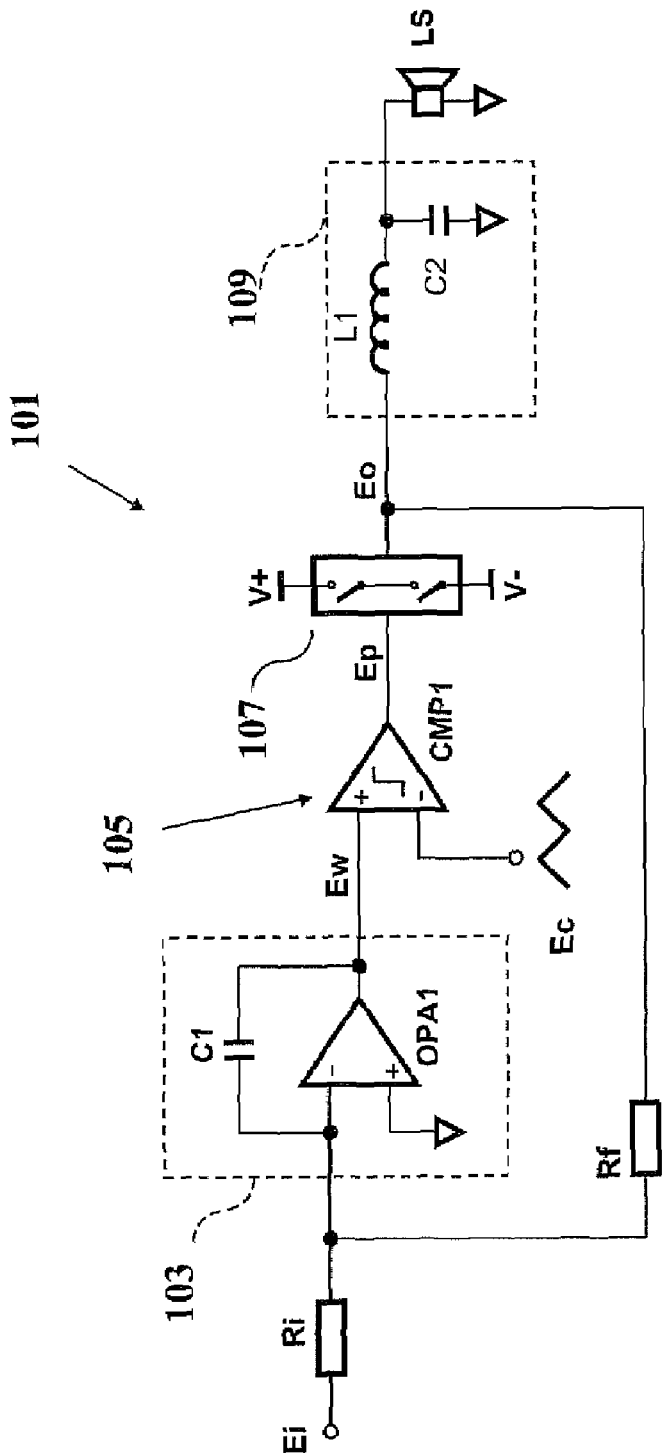
FIG. 1 shows a block diagram of a prior art embodiment of a PWM amplifier.

Referring to FIG. 1, a diagram of prior art pulse-width modulation (PWM) amplifier 101 with first order loop filter 103 is shown as disclosed in U.S. Pat. No. 4,504,793. In prior art amplifier 101, pulse-width modulation is accomplished by inputting an input voltage signal Ei and a fed-back version of output signal Eo through serially connected integrator circuit 103 (also referred to as a loop filter) and comparator CMP1 (105). The loop filter output Ew is modified by the difference between the input signal Ei and output signal Eo such that any difference between the input signal Ei and the time-averaged value of the output signal Eo are substantially amplified. Comparator 105 compares loop filter output voltage signal Ew with a pre-determined triangular carrier voltage signal Ec to produce a stream of voltage signal pulses Ep with the same frequency as the carrier signal Ec and pulse-widths that are proportional to the amplitude of Ew. Pulsed signal stream Ep drives the switching output stage 107, such that when a pulse of stream Ep is high (or has a positive voltage) the switches are closed to connect Eo to a positive high voltage supply V+, and when Ep is low (or has a negative voltage) the switches are closed to connect Eo to a negative high voltage supply V−. Ouput voltage stream Eo is passed through low pass filter 109 to reduce transients and then drive speaker LS. The output of a PWM amplifier is a pulse stream with the signal content in the low-frequency audio band and images at integral multiples of the carrier frequency (fs).

Integrating filter 103 includes operational amplifier OPA1 having its positive input terminal connected to ground and its negative input terminal connected to resistors Ri and Rf and capacitor C1 which are used to integrate the combined input and feedback signals. Switching output stage 107 comprises a set of power switches that operate in the fully 'ON' or fully 'OFF' states so that minimal power loss occurs and very high efficiency can be achieved with PWM amplifier 101. Passive low-pass filter 109 comprising inductor L1 and capacitor C2 is used to remove undesirable noise and recover desired signal content from output signal Eo. The filtered output signal is then delivered to speaker LS.

Figure 2:
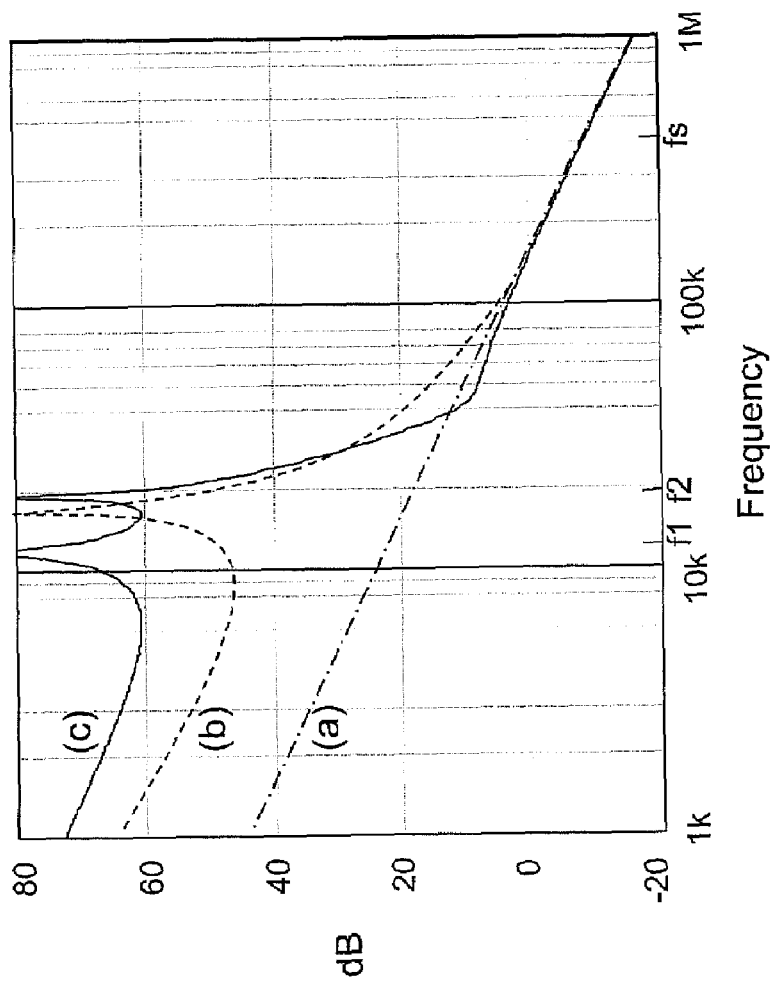
FIG. 2 shows a plot that compares the loop filter frequency response of the prior art PWM amplifier (a) to that of a 3rd order (b) and a 5th order (c) embodiment of the present invention.

Referring to FIG. 2, a plot is shown that describes the performance of the integrating filter stage of respective PWM amplifiers in terms of characteristic curves reflecting gain versus frequency. The plot demonstrates a marked improvement in loop gain over the entire 0-20 kHz audio band obtained by selected of the herein described present inventions versus the prior art embodiment of FIG. 1. In stable closed loop operation, any error that is generated by the pulse-width modulation process and the switching output stage is effectively attenuated by the gain $1/(2Pi*f*Rf*CI)$ of the integrating filter. Characteristic curve (a) in FIG. 2 shows the frequency response of integrating filter 103 of the prior art. It may be seen that at 1 kHz, 43 dB of gain is available over integrating filter 103 to suppress noise (and distortions) produced over the comparator 105 and switching output stage 107. However, the integrating filter must roll off to 0dB sufficiently below the carrier frequency fs for stable loop operation. Note that at 10 kHz only 23 dB is available for noise suppression and at 20 kHz this drops to 17 dB. If greater noise suppression is desired, for instance at the higher portion of the audio band, the gain-bandwidth product of integrating filter 103 and carrier frequency fs need to be increased to maintain stability. Curves (b) and (c) in FIG. 2 show an increase of available gain over the prior art in the high-order loop filters of two embodiments of the present invention which are described more fully below.

Figure 3:
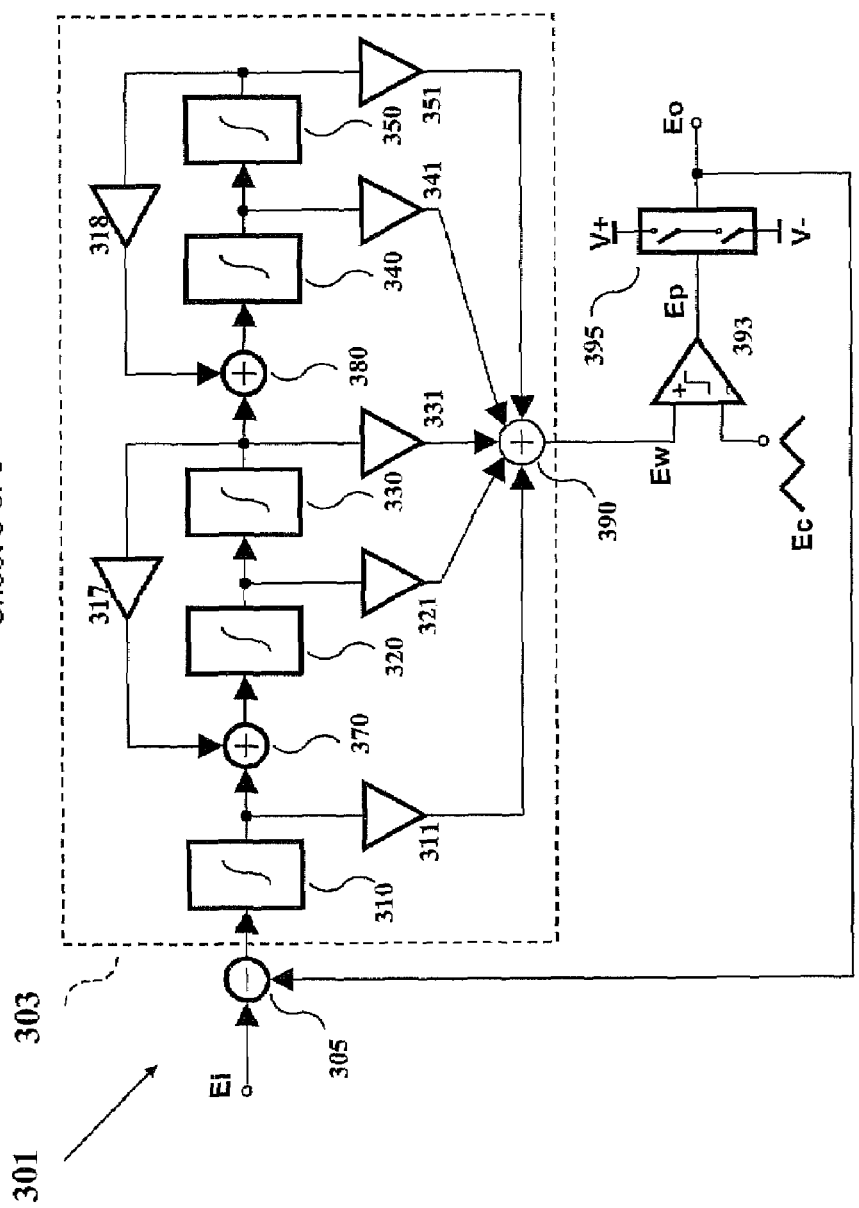
FIG. 3 shows a 5th order embodiment of a PWM amplifier in accordance with the invention.

Referring to FIG. 3, a block diagram of PWM amplifier 301 with 5th order loop filter 303 is shown which is an embodiment of the present invention. Subtractor 305 takes the difference between the input signal Ei and amplifier output signal Eo and provides the input to loop filter 303. The loop filter input signal is integrated over a 5th order integration function comprised of a series chain of integrators 310, 320, . . . , 350. Each of the outputs of integrators 310, 320, . . . 350 are multiplied over respective multipliers 311, 321, . . . 351 characterizing filter coefficients A1, A2, . . . A5. The outputs of multipliers 311, 321, . . . 351 are summed with summer 390. The output of summer 390 comprises output signal Ew of loop filter 303. Loop filter output signal Ew and triangular carrier signal Ec are input to comparator 393 generating pulse-width modulated signal Ep. Pulsed signal stream Ep drives the switching output stage 395, such that when a pulse of stream Ep is high (or has a positive voltage) the switches are closed for the width of the pulse and the corresponding pulse of output voltage stream Eo is driven to a voltage of V+ for the length of the pulse width of the corresponding pulse of pulsed stream Ep, and V− for all other times. Local feedback multipliers 317 and 318 characterizing coefficients B1 and B2 feed back a small amount of signal around consecutive integrators to form resonators. Feedback multiplier 317 feeds back signal from the output of integrator 330 to the input of integrator 320 through summer 370. Feedback multiplier 318 feeds back signal from the output of integrator 350 to the input of integrator 340 through summer 380. The effect of the resonators can be seen in loop filter frequency response (c) of FIG. 2. The resonators cause sharp peaks at frequencies f1 and f2, and have the effects of providing very large amount of gain near their resonance frequencies. By strategic placement of resonance frequencies within the band-of-interest, the loop filter gain can be optimally distributed to provide high noise suppression across the entire audio band. Filter coefficients A1, A2, . . . , A5 are chosen to match the high frequency response (near unity gain) to that of the prior art single integrator filter thereby providing similar stability characteristics.

A 3rd order embodiment of the invention (not shown) can be constructed by taking the embodiment shown in FIG. 3 and removing integrators 340 and 350, multipliers 318, 341, 351, and summer 380.

Referring to FIG. 2, curve (b) shows the performance of a 3rd order embodiment of the invention as providing more than 46 dB of gain across the entire audio band while the prior art single integrator filter (a) provides less than 17 dB near the 20 kHz audio band edge. The improvements are even more pronounced for a 5th order embodiment of the invention as shown by curve (c). FIG. 2 shows that with the use of the 5th order embodiment of the present invention more than 60 dB of gain can be achieved across the entire 20 kHz audio band—more than 43 dB of improvement over the prior art at 20 kHz, and 35 dB of improvement at 8 kHz. By example, with loop gains of as much as 60 dB to suppress noise and distortions, very high fidelity PWM amplifiers can be easily constructed.

It may further be appreciated that PWM amplifier 301 with $5^{th}$ order loop filter 303 structure in FIG. 3 can be generalized to arbitrary orders N as determined by the number of integrators connected in series. Moreover, a number of alternative filter structures can be used to implement the desired loop filter response.

Figure 4:
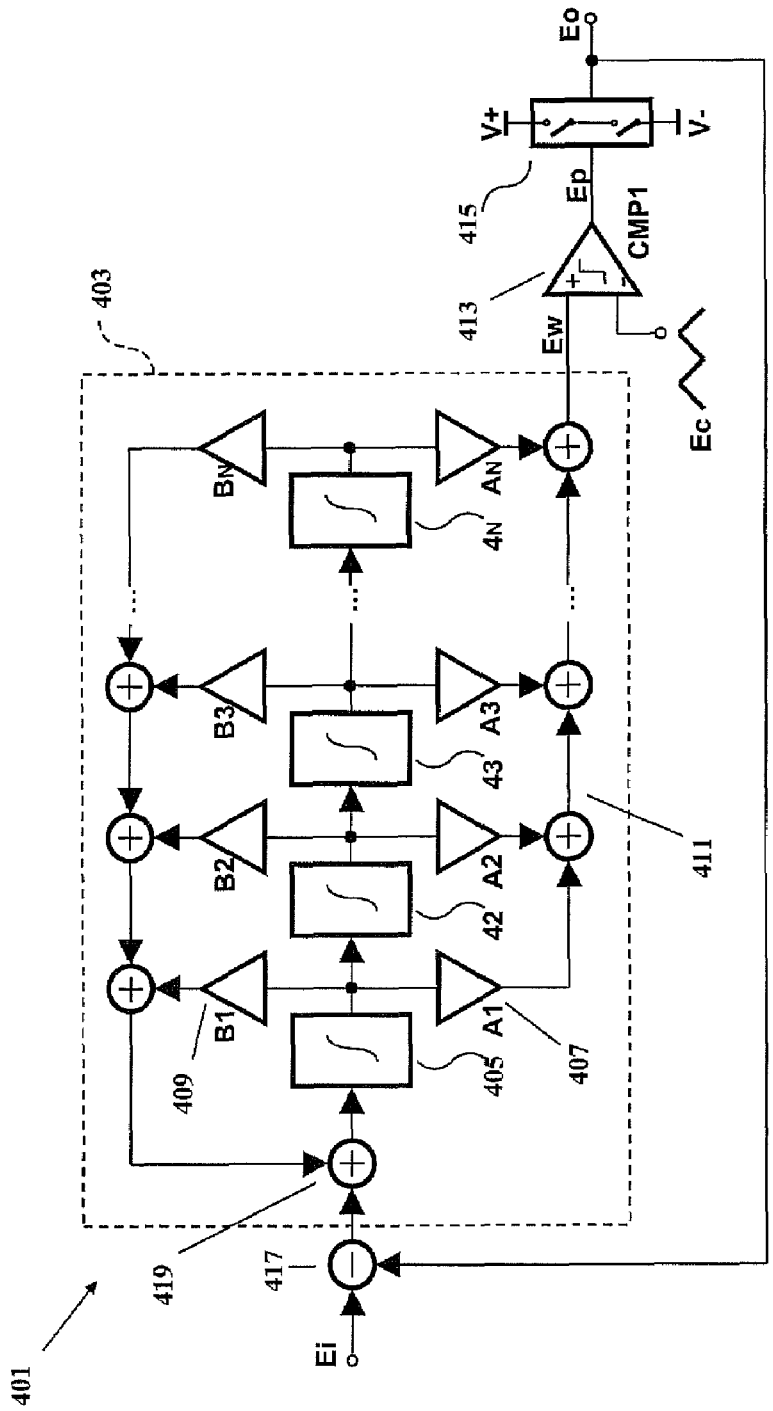
FIG. 4 shows a block diagram of an alternative embodiment of a PWM amplifier with a generalized Nth order loop filter in accordance with the present invention.

By example, referring to FIG. 4, a block diagram of PWM amplifier 401 with generalized $N^{th}$ order loop filter 403 is shown which is a generalized alternative embodiment of the present invention using an alternative loop filter structure. $N^{th}$ order loop filter 403 incorporates N feedback multipliers characterizing $B_N$ filter coefficients and N feedforward multipliers characterizing $A_N$ filter coefficients that can provide additional freedom in setting the loop filter characteristics. In this embodiment, each integrator 405 has respective feedforward and feedback multipliers 407, 409 attached to its output. Feedforward multipliers 407 multiplies the respective integrator output with respective filter coefficients $A_N$. Output signals from the feedforward multipliers 407 are summed over summer 411 and input to comparator 413 as signal Ew. Carrier frequency triangular signal Ec is also input to comparator 413 and used to modify signal Ew into pulse-width modulated signal Ep. Pulse-width modulated signal Ep controls the switching of switch 415 to deliver output signal Eo. As in the prior embodiment, output signal Eo is fed back and differenced with incoming signal Ei through subtractor 417. The differenced signal is input to loop filter 403. Feedback multipliers 409 multiplies the respective integrator output with respective filter coefficients $B_N$. Output signals from feedback multipliers 407 are summed together with the input differenced signal over summer 419 and the result is input to the series of integrators 405.

Figure 5:
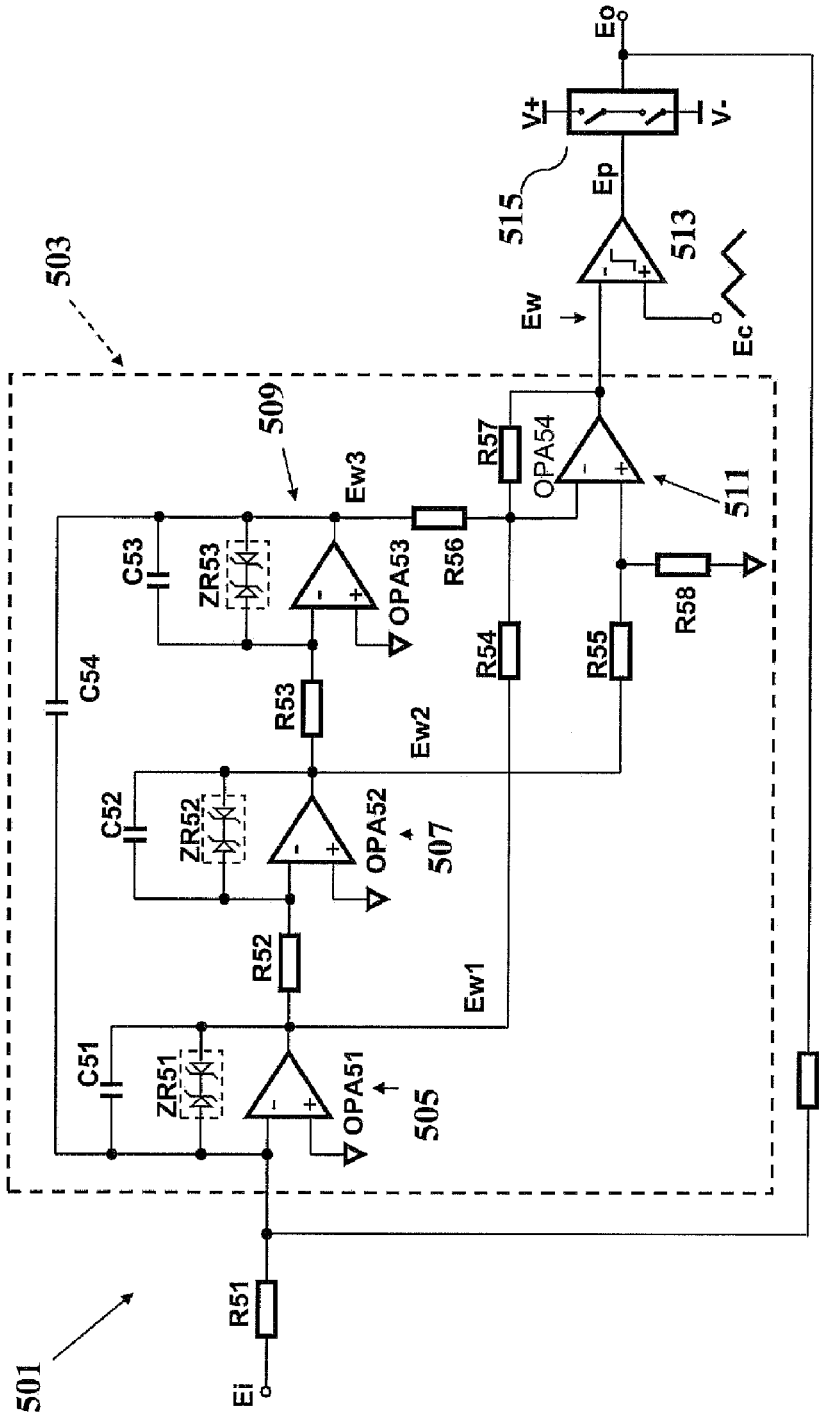
FIG. 5 shows a block diagram of PWM amplifier with a 3rd order loop filter and including overload recovery structure in accordance with the invention.

Referring to FIG. 5, a block diagram of PWM amplifier 501 with a $3^{rd}$ order loop filter 503 is shown which is an alternative embodiment of the present invention. $3^{rd}$ order loop filter 503 represents yet another alternative circuit design comprising a series of three integrators 505, 507, 509 that produces the loop filter response shown in curve (b) of FIG. 2. Integrators 505, 507, 509 are implemented as active RC integrators with respective operational amplifiers OPA51, OPA52, and OPA53, input resistors R51, R52, and R53, integrating capacitors C51, C52, and C53, and zener diodes ZR51, ZR52, and ZR53. The $B_1$ feedback coefficient as characterized in the previous embodiments is implemented by capacitor C54 that feeds back a small amount of signal from the OPA53 output to the input of OPA52 after being effectively inverted by OPA51 in order to feed back signal in the correct polarity.

In loop filter 503, integrator output signal Ew2 is passed through a voltage divider comprised of resistors R55, R58 and to the positive input of opamp 511; output signal Ew3 is passed through a voltage divider comprised of resistors R56, R57 and to the negative input of opamp 511. Output signal Ew1 is passed through resistors R54, R57 and combined with the output signal from opamp 511 to develop loop filter output signal Ew. Loop filter output signal Ew and carrier signal Ec are input to comparator 513 to develop pulse width modulated signal Ep. Pulse width modulated signal Ep is delivered to switch 515 to control the operation and develop amplifier output signal Eo. Output signal Eo is fed back through resistor R59 to the negative input node of opamp 505 and input signal Ei is passed through resistor R51 to the negative input node of opamp 505.

In one family of PWM amplifiers, carrier signal Ec may be selected as a 2V peak-to-peak triangular wave with a frequency preferably selected in the range of 300-500 kHz. By example, the component values of PWM amplifier 501 may be as follows:

R52 11 k
R53 22 k
R54 5.1 k
R55 27 k
R56 20 k
R57 10 k
R58 10 k
R59 24 k
C51 1000 pf
C52 100 pf
C53 100 pf
C54 27 pf
V++12 v
V--12 v

In this embodiment, ZR51, ZR52, and ZR53 are each implemented with a pair of back-to-back connected zener diodes with a breakdown voltage of 5.1 V to provide overload handling that simply clips or saturates and comes back into linear operation immediately when the overload condition is no longer present. The overload handling is accomplished in PWM amplifier 501 by using voltage clamps ZR51, ZR52, and ZR53 to limit the integrator state to within plus or minus of the clamp voltage (+/−5.7V), and by designing the loop filter output summer (OPA54, R54, R55, R56, R57, and R58) to allow sufficient gain for the first integrator, OPA51, to maintain stable closed loop operation even when the two subsequent integrators are still saturated. The voltage clamps are placed across the integrator capacitor; for example ZR52 is placed across C52 to limit the integrator output Ew2 to within plus or minus the clamp voltage. The clamp voltage is set sufficiently larger than the maximum expected signal during normal operation so that the voltage clamps do not interfere with normal signal processing except in the event of an overload situation. In an overload event, the integrator may be saturated and its output Ew2 may be clamped, for example at +5.7V. As long as the overload condition exists, Ew1 is negative and Ew2 remains clamped at +5.7V. Once the overload condition is removed and Ew1 crosses zero and turns positive, Ew2 integrates down from +5.7V and the integration function is restored immediately. It is important for the integrators to avoid any delays in the transition from saturation to linear operation because delays will constitute additional dynamic mechanisms that can prevent the system from coming back into stable closed loop operation.

In PWM amplifier 501, the output summer is designed to produce signal Ew according to the following equation:

$$Ew=(2\times-Ew1)+(1\times Ew2)+(0.5\times-Ew3)$$

The absolute magnitude of gain from the first integrator output Ew1, |2|, is greater than the sum of the absolute magnitudes of gains of the other inputs (|1|+|0.5|=1.5). Therefore, even if Ew2 and Ew3 are saturated, there is sufficient gain from the first integrator, Ew1, to override Ew2 and Ew3, and control the loop filter output Ew to enable stable closed loop operation. The sequence of events from an overload recovery is as follows: During overload, the integrators may all be saturated—for example, Ew1=+5.7V, Ew2=−5.7V, and Ew3=+5.7V. Once the overload condition is removed, the first integrator immediately comes out of saturation and Ew1 starts integrating down in voltage. Because the filter output summer gives much higher gain to the Ew1 input, Ew1 is able to control Ew and the system behaves just as in a single integrator system which is inherently stable. As Ew1 continues to integrate toward zero and turns negative, the second integrator immediately comes out of saturation and Ew2 starts moving up from −5.7V. With the first and second integrator operating linearly, the system behaves as a stable 2nd order system, until the third and last integrator comes out of saturation. During the period immediately following the overload condition, the system automatically maintains a stable configuration. With this configuration, the high order loop system exhibits a simple clipping effect when overloaded and is perceived to come back immediately into linear operation when the overload condition is removed.

Figure 6:
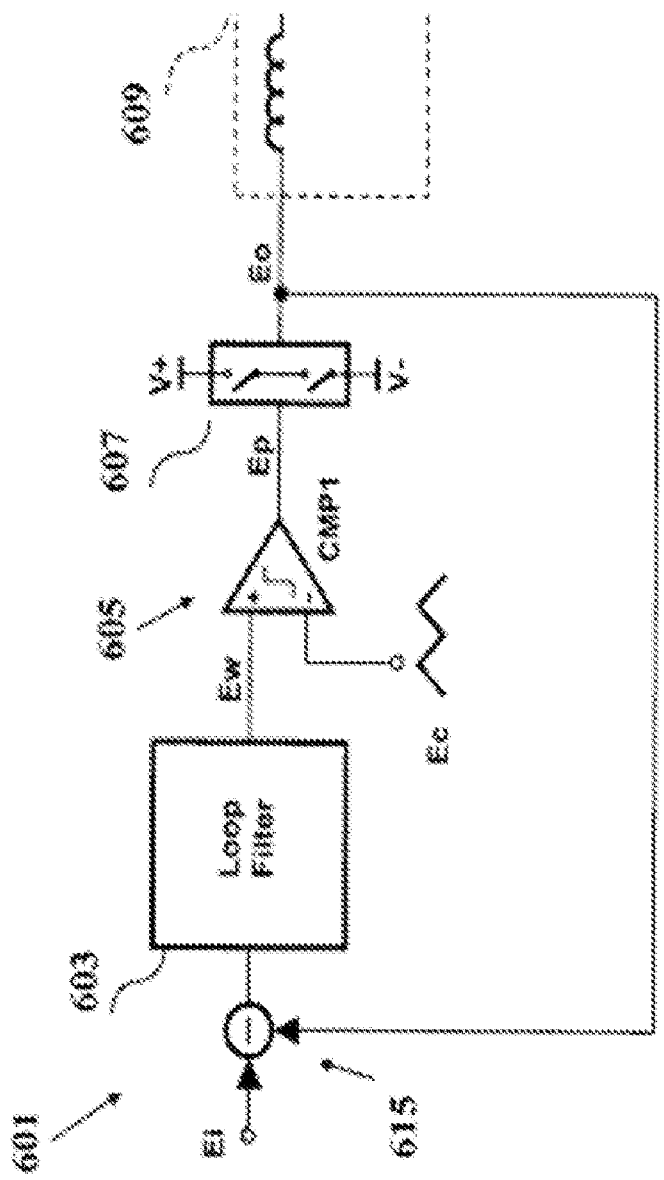
FIG. 6 shows a generalized block diagram of a PWM amplifier system in accordance with the present invention.

Referring to FIG. 6, a generalized block diagram of PWM amplifier system 601 is shown which is an embodiment of the present invention. Loop filter 603 includes an $n^{th}$ order integrator where 'n' is greater than one. Output signal Ew is produced from loop filter 603 and delivered to comparator 605. Comparator 605 also receives carrier signal Ec and uses the carrier signal to generate pulse width modulated signal Ep corresponding to loop output signal Ew. Pulse width modulated signal Ep controls the operation of switch 607 which transmits a high voltage output signal Eo. The signal passing through low pass filter 609 is delivered to output device/s 610, such as a speaker and/or display console e.g. palm pilot, monitor, etc. Subtractor 615 receives input signal Ei, subtracts a fed back version of output signal Eo, and delivers the resulting signal to loop filter 603.

The above description of illustrated embodiments of the invention is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize. For instance, specific component values and voltage supply values are for the sake of illustration and explanation. Various embodiments of the invention may utilize values that are different from what is specified herein. Additionally, the terms used in the following claims should not be construed to limit the invention to the specific embodiments disclosed in the specification and the claims. Also, while the representative range of carrier frequencies are presented by example for audio applications. Other ranges of frequencies may be more desirable for industrial applications such as sensors or measuring instrumentation depending on the types of signal measurements or instrument environments. For example with EEG or EKG equipment, seismic imaging instrument, motor controllers, switching voltage regulators or DC-to-AC power inverters where the signal of interest may be of very low frequencies, a much lower carrier frequency may be desirable. In other applications, such as radio telescope, arbitrary waveform generator for ATE (automatic test equipment) or ultrasound imaging, very high carrier frequencies may be more desirable. Additionally, for different input and carrier frequencies, the herein described circuit blocks may be required to be modified in order to properly perform the described functions. For instance, at very high frequencies, opamps, resistors, capacitors, and inductors perform differently, and the respective blocks would require corresponding modifications in order for given blocks to perform the required functions as described herein.

What is claimed is:

1. A PWM digital amplifier for amplifying a digital signal, the digital amplifier comprising:
   a pulse width modulator section, the pulse width modulator section having an input portion for receiving an input digital signal and an output for outputting a pulse width modulated and amplified signal;
   the pulse width modulated section characterized by the pulse width modulated and amplified signal having a magnitude value no less than 40 dB over a range of frequencies,
   the range of frequencies having a bandwidth greater than 1 kHz.

2. The PWM digital amplifier of claim 1 wherein the range of frequencies having a bandwidth of at least 10 kHz.

3. The PWM digital amplifier of claim 1 wherein the range of frequencies having a bandwidth of at least 15 kHz.

4. The PWM digital amplifier of claim 1 wherein the range of frequencies having a bandwidth of at least 20 kHz.

5. The PWM digital amplifier of claim 1, the PWM digital amplifier including
   a feedback loop, the feedback loop connected to the output and the input of the pulse width modulator section for carrying a feedback signal.

6. The PWM digital amplifier of claim 1, the pulse width modulator section including
   an integrator section and a comparator section; and the integrator section for integrating an input digital signal, the comparator section connected to receive an integrated digital signal from the integrator section and transform the integrated signal into a pulse width-modulated signal using a periodic modulator signal.

7. The PWM digital amplifier of claim 6, the PWM digital amplifier including
   a periodic modulator signal source.

8. The PWM digital amplifier of claim 7 wherein the periodic modulator signal source produces a sawtooth signal waveform.

9. The PWM digital amplifier of claim 5 wherein the input digital signal is produced from an external digital signal supplied by an external signal source and the feedback signal.

10. The PWM digital amplifier of claim 5 including
    an input junction for receiving digital signals generated from an external signal source and the feedback signal and transferring the input digital signal to the pulse width modulator section,
    the input digital signal resulting from the external digital signal supplied by an external signal source and the feedback signal.

11. The PWM digital amplifier of claim 9 wherein the input digital signal comprises
    a summation of the external digital signal and the feedback signal.

12. The PWM digital amplifier of claim 9 wherein the input digital signal comprises
    a subtraction of the feedback signal from the external digital signal.

13. The PWM digital amplifier of claim 6, the comparator section connected to an external signal generator to receive the periodic modulator signal.

14. The PWM digital amplifier of claim 6 wherein the periodic modulator signal comprises a sawtooth signal.

15. The PWM digital amplifier of claim 13 wherein the external signal generator generates a sawtooth signal.

16. The PWM digital amplifier of claim 1, the pulse width modulator section including
    a switch for driving the pulse width modulated and amplified signal to a predetermined range of values.

17. The PWM digital amplifier of claim 6, the pulse width modulator section including
    a switch connected to the comparator section for driving a signal output from the comparator section to a pre-determined range of values.

18. The PWM digital amplifier of claim 16 including
    a feedback loop and a feedback loop junction;
    the feedback loop junction connecting the output of the switch to the feedback loop and an output branch;
    the feedback loop connecting the feedback loop junction to the input of the pulse width modulator section for communicating a feedback signal from the pulse width modulated and amplified signal.

19. The PWM digital amplifier of claim 18 including
    a filter connected to the output branch, the filter for reducing undesirable signals.

20. The PWM digital amplifier of claim 19, the filter comprising
    a low pass filter.

21. The PWM digital amplifier of claim 19, the filter comprising
    a passive filter.

22. The PWM digital amplifier of claim 18 including
    a speaker connected to the output branch.

23. A pulse width modulated digital amplifier for amplifying an incoming digital signal $E_i$ and generating an output digital signal $E_o$, the digital amplifier including
    a digital signal amplification section for digitally amplifying a pulse-width modulated digital signal; and
    a feedback loop for carrying a portion of the output digital signal $E_o$;
    the digital signal amplification section characterized by the pulse width modulated signal having a magnitude value no less than 40 dB over a range of frequencies,
    the range of frequencies having a bandwidth greater than 1 kHz.

24. A PWM digital amplifier for amplifying a digital signal, the PWM digital amplifier comprising:
    a pulse width modulator section, the pulse width modulator section having an input portion for receiving an input digital signal and an output for outputting a pulse width modulated and amplified signal $E_o$; and
    a feedback loop for channeling a portion of the signal $E_o$ external to the loon filter through a passive element and combining with the input signal $E_i$,
    the pulse width modulator section including
    a multi-stage loop filter for producing a stable loop output signal $E_w$ from an input digital signal $E_i$, a comparator for receiving loop ouput signal Ew and a pre-selected signal, the comparator generating a pulse-width modulated signal Ep from the preselected signal and signal Ew, and a switching ouput stage for receiving pulse-modulated signal Ep and generating the pulse modulated and amplified signal Eo;

the pulse width modulator section characterized by the pulse width modulated and amplified signal having a magnitude value no less than 40 dB over a range of frequencies, the range of frequencies having a bandwidth greater than 1 kHz.

\* \* \* \* \*